United States Patent
Wohl et al.

(10) Patent No.: US 12,117,488 B1
(45) Date of Patent: Oct. 15, 2024

(54) MULTIPLE CLOCK AND CLOCK CYCLE SELECTION FOR X-TOLERANT LOGIC BUILT IN SELF TEST (XLBIST)

(71) Applicant: Synopsys, Inc., Mountain View, CA (US)

(72) Inventors: Peter Wohl, Williston, VT (US); John Arthur Waicukauski, Tualatin, OR (US)

(73) Assignee: Synopsys, Inc., Sunnyvale, CA (US)

( * ) Notice: Subject to any disclaimer, the term of this patent is extended or adjusted under 35 U.S.C. 154(b) by 0 days.

(21) Appl. No.: 18/208,886

(22) Filed: Jun. 13, 2023

(51) Int. Cl.
| | |
|---|---|
| *G01R 31/317* | (2006.01) |
| *G01R 31/3177* | (2006.01) |
| *G01R 31/3183* | (2006.01) |
| *G01R 31/3187* | (2006.01) |

(52) U.S. Cl.
CPC . *G01R 31/31724* (2013.01); *G01R 31/31727* (2013.01); *G01R 31/3177* (2013.01); *G01R 31/318307* (2013.01); *G01R 31/3187* (2013.01)

(58) Field of Classification Search
CPC ........ G01R 31/31724; G01R 31/31727; G01R 31/318307; G01R 31/3177; G01R 31/3187
USPC ................ 714/733, 731, 738, 739, 742, 744
See application file for complete search history.

(56) References Cited

U.S. PATENT DOCUMENTS

| | | | | |
|---|---|---|---|---|
| 8,448,008 B2* | 5/2013 | Hapke | ............ | G01R 31/318552 714/724 |
| 8,633,725 B2* | 1/2014 | Gorti | .................. | G01R 31/3177 324/762.01 |
| 9,903,913 B2* | 2/2018 | Gorti | ................ | G01R 31/31727 |
| 11,237,587 B1* | 2/2022 | Kishore | .................. | G06F 11/27 |
| 2002/0138801 A1* | 9/2002 | Wang | ............... | G01R 31/31705 714/729 |
| 2009/0210763 A1* | 8/2009 | Eckelman | ...... | G01R 31/318536 714/E11.002 |
| 2010/0251045 A1* | 9/2010 | Hapke | ............ | G01R 31/318552 714/724 |
| 2012/0062266 A1* | 3/2012 | Gorti | ............. | G01R 31/318552 29/25.01 |
| 2014/0359386 A1* | 12/2014 | Gorti | ............. | G01R 31/318552 714/727 |
| 2016/0131707 A1* | 5/2016 | Wang | ............ | G01R 31/318583 714/731 |

OTHER PUBLICATIONS

Wohl et al., Selective Multiple Capture Test (SMART) XLBIST, Jul. 24, 2022, IEEE, pp. 1-6. (Year: 2022).*

* cited by examiner

*Primary Examiner* — John J Tabone, Jr.

(74) *Attorney, Agent, or Firm* — Andrew L. Dunlap; Haynes Beffel & Wolfeld LLP

(57) ABSTRACT

A system and method are provided for testing logic using a logic built in self-test (LBIST) system, and in particular where the LBIST system tolerates unknown inputs (Xs) to the logic cells forming an XLBIST system. The system allows for providing multiple test system clocks from the LBIST system to the logic during a system clock capture cycle of a system clock during testing of the logic, wherein the system clock is separate from the multiple test system clocks of the LBIST system. Further, timing of an application of clock cycles of the multiple test system clocks of the LBIST system is controlled and provided to the logic during the system clock capture cycle.

20 Claims, 9 Drawing Sheets

Table I: Design A Stuck-At and Transition Model Results

| Intervals | Stuck-At Fault Model Coverage Results | | Transition Fault Model Coverage Results | |
|---|---|---|---|---|
| | Without SMART XLBIST Feature | With SMART XLBIST Feature | Without SMART XLBIST Feature | With SMART XLBIST Feature |
| 10 | 81.73 | 88.29 | 49.69 | 61.22 |
| 20 | 86.89 | 92.3 | 60.24 | 70 |
| 30 | 89.97 | 93.83 | 65.41 | 74.25 |
| 40 | 91.51 | 94.61 | 68.47 | 77.2 |
| 50 | 92.37 | 95.22 | 70.69 | 79.12 |
| 60 | 93.05 | 95.62 | 72.32 | 80.46 |
| 70 | 93.56 | 95.88 | 73.7 | 81.56 |
| 80 | 93.95 | 96.1 | 74.71 | 82.38 |
| 90 | 94.29 | 96.26 | 75.61 | 83.06 |
| 100 | 94.55 | 96.39 | 76.39 | 83.68 |

Table II: Design B Stuck-At and Transition Model Results

| Intervals | Stuck-At Fault Model Coverage Results | | Transition Fault Model Coverage Results | |
|---|---|---|---|---|
| | Without SMART XLBIST Feature | With SMART XLBIST Feature | Without SMART XLBIST Feature | With SMART XLBIST Feature |
| 10 | 82.84 | 88.97 | 55.19 | 68.05 |
| 20 | 86.21 | 90.98 | 62.17 | 73.05 |
| 30 | 88.30 | 91.86 | 65.25 | 75.47 |
| 40 | 89.15 | 92.38 | 68.09 | 77.02 |
| 50 | 89.95 | 92.75 | 69.52 | 78.14 |
| 60 | 90.36 | 93.04 | 71.12 | 78.93 |
| 70 | 90.80 | 93.26 | 72.02 | 79.59 |
| 80 | 91.05 | 93.44 | 73.09 | 80.14 |
| 90 | 91.34 | 93.59 | 73.73 | 80.59 |
| 100 | 91.56 | 93.77 | 74.49 | 81.01 |

FIG. 7

MULTIPLE CLOCK AND CLOCK CYCLE SELECTION FOR X-TOLERANT LOGIC BUILT IN SELF TEST (XLBIST)

TECHNICAL FIELD

The present disclosure generally relates to system on a chip (SoC) having logic built in logic self-testing (LBIST) capability. More particularly, the present disclosure relates to SoCs with fault or X-tolerant LBIST (XLBIST) capability.

BACKGROUND

LBIST technology is increasingly deployed in silicon systems on a chip (SoC). For example, in the automotive industry and other industries silicon lifecycle management (SLM) is now used with in-chip monitoring. Chip complexity and long-term reliability requirements drive the need for post-silicon analysis and maintenance in the form of the LBIST. LBIST can provide in-chip monitoring that is part of SLM and can provide visibility into performance and reliability during the entirety of a chip's lifespan.

SUMMARY

Embodiments provide a system and method for testing logic using a logic built in self-test (LBIST) system, and in particular where the LBIST system tolerates unknown inputs (Xs) to the logic cells forming an XLBIST system. The system allows for providing multiple test system clocks from the LBIST system to the logic during a system clock capture cycle to limit faults or disturb conditions that could result in test errors. Further, timing of an application of clock cycles of the multiple test system clocks of the LBIST system is controlled and provided to the logic during the system clock capture cycle to limit disturbs. Embodiments further provide for staggering pulses of a number of clocks of the multiple test system clocks of the LBIST system during the system clock capture cycle to prevent disturbs.

Embodiments provide for selection of multiple test system clocks during testing, including selection of a primary clock as well as secondary clocks. To select the primary clock, a clock is identified from the multiple test system clocks of the LBIST system that have been used at most a first set minimum number of times in previous system clock capture cycles where the LBIST system was applied. A primary clock is further selected from test clocks where unknowns (Xs) occurred more than a threshold number of times to limit disturb conditions. The unknown (Xs) occur when an input state to a logic gate being at a 0 or a 1 is unknown when testing the logic that can cause a disturb condition. A cell can be either a single logic gate or groups of logic gates. The disturb cells can occur in logic that receive inputs as clocked by two different selected test clocks that are not aligned and have clock cycles that transition at different times resulting in a different logic cell output during different portions of the clock capture cycle. The primary clock is, thus, selected to prevent such disturb conditions by limiting their selection to include test clocks that have limited Xs in the past.

Embodiments further include selecting secondary clocks to selectively provide from the multiple test system clocks from the LBIST system. To select the secondary clocks, clocks are identified from the multiple test system clocks of the LBIST system that have been used at most a second set second minimum number of times in previous system clock capture cycles where the LBIST system was applied, the second set minimum number being higher than the first minimum number used for selection of the primary clock. Similar to the primary clock, secondary clocks are not selected if the number of Xs occurring in the past is greater than a threshold.

Staggering of clock pulses is provided in embodiments for further prevent disturb conditions. Staggering is provided in a first embodiment for individual pulses of test clocks applied to prevent stuck-at fault disturbs where two clock pulses that are not aligned occur near the same time and could potentially cause disturb conditions. Staggering is also provided in a second embodiment for clock pairs to prevent transition type disturb conditions that can occur at the transition of a system capture cycle when the pair of test clocks could both pulse near the capture cycle transition and create a disturb. The staggered pair of clocks includes a test clock from the test launch cycle along with a system clock of the capture cycle. Staggering of the pair of clocks prevents disturb conditions due to two such clocks that transition near the edge of a clock capture cycle.

BRIEF DESCRIPTION OF THE DRAWINGS

The disclosure will be understood more fully from the detailed description given below and from the accompanying figures of embodiments of the disclosure. The figures are used to provide knowledge and understanding of embodiments of the disclosure and do not limit the scope of the disclosure to these specific embodiments. Furthermore, the figures are not necessarily drawn to scale.

FIG. 7 provides two tables showing results of applying the LBIST system according to some embodiments of the present disclosure.

DETAILED DESCRIPTION

Figure 1:
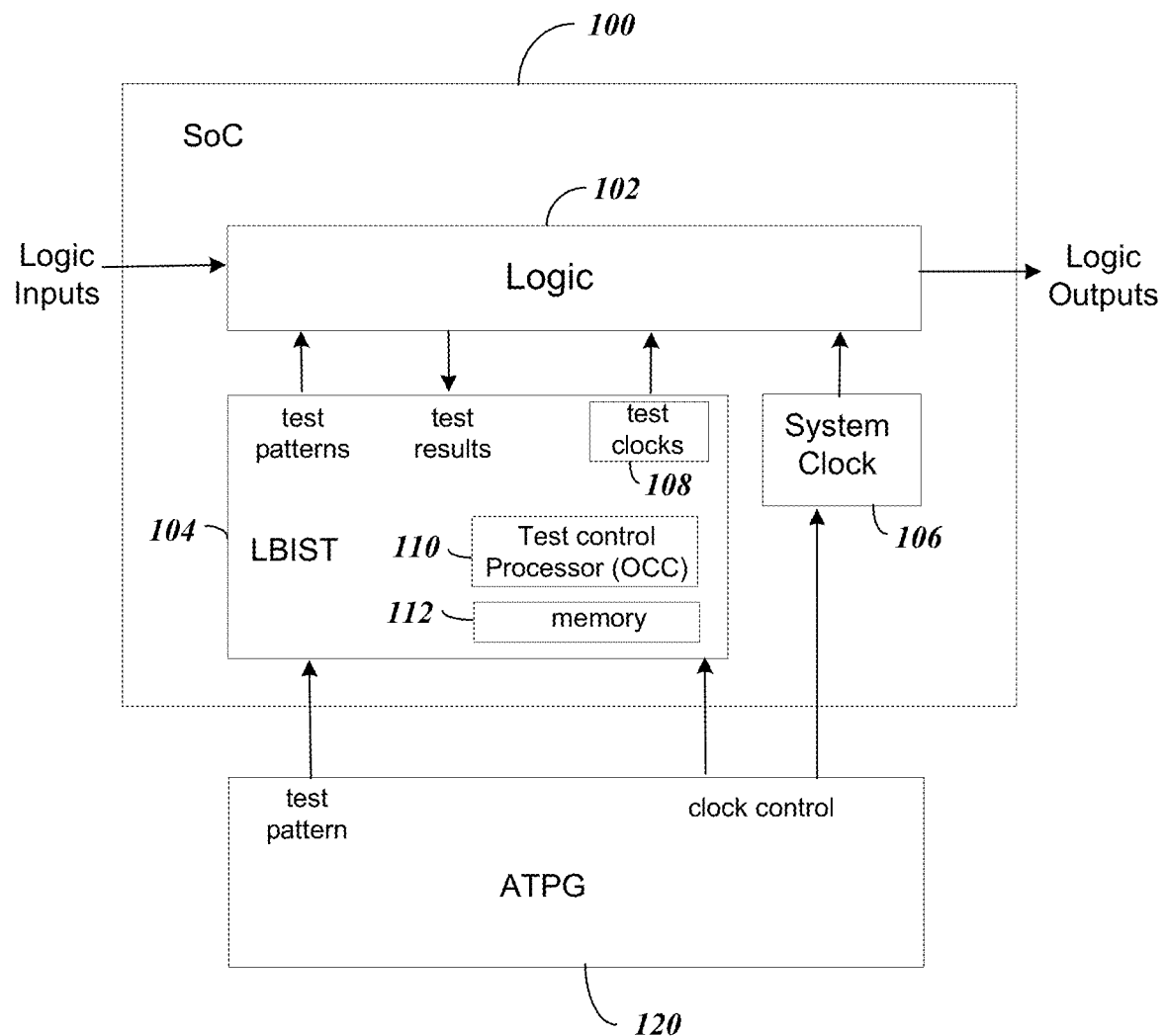
FIG. 1 provides a block diagram showing system components used in according to some embodiments of the present disclosure.

Logic built in self-test (LBIST) is increasingly deployed to realize test cost reduction and silicon life-cycle management. A problem with LBIST system test coverage is that test coverage is limited by random-resistant faults. X-tolerant LBIST (XLBIST) expands the applicability of LBIST to almost any design in the presence of unknown fault (X) values. XLBIST test coverage can handle some random faults, but XLBIST test coverage is still limited by reduced observability due to fault values that mask test results within multiple clock cycles during testing when testing is provided substantially with a single clock cycle.

Existing LBIST technology can be limited to either one clock cycle (for stuck-at fault model) or two clock cycles (for transition fault model). Within testing performed within one or two clock cycles, only a limited number of clocks can be pulsed, otherwise too many unknown faults (Xs) would diminish the effectiveness of the test patterns.

In embodiments the XLBIST test patterns and testing is, thus, expanded to multiple clocks and multiple cycles to improve test ability. This allows more clocks to be used and more than a single clock cycle for detection of transition faults that can be designated and accounted for. Further, the clocks are not limited to groupable or synchronized clocks.

Several benefits are provided by the selectability of multiple clocks and multiple clock cycles for testing. Multiple clocks enable increased test observability and higher degree of test coverage. Multiple clocks can also allow for testing across clock-domain faults providing for a higher degree of test coverage. Similarly, the availability of multiple cycles can better test for random resistant faults providing for a higher degree of test coverage.

Multiple clock cycles, however, can increase faults (Xs) and mask faults. Selection and control of clocks and selection of clock cycles in embodiments enables control and elimination of increased faults. In embodiments, the following selections can be provided: (1) primary clock: (2) secondary clock; and (3) staggering of clock cycle pulses.

Embodiments described herein provide an LBIST system that allows for providing multiple test system clocks and control of transition of the pulses of the multiple test system clocks.

With selection of clocks and clock cycles, multiple test parameters can be implemented and controlled. First, test coverage range can be set based on selection of clocks. Further, X-tolerant testing can be performed based on selection of test clocks and control of clock pulses. With control of test clock pulses, testing of functionality using staggered clock pulses can be implemented. Further, multiple clocks allow testing for cross-clock domain transition faults.

Further, testing of a synchronous on chip controller (OCC) can be provided by generating clock pulses between each synchronous clock domain pulse that go through the OCC, allowing test coverage of faults between the clock domains.

Embodiments described herein also introduce automatic test pattern generation (ATPG) driven multiple capture-clock selection which greatly increases the XLBIST coverage per test pattern. Selection of both clocks and clock cycles is provided for in the ATPG. In embodiments described herein, the number of clock cycles is extended and only limited by the capability of the clocking of the test system on the SoC. The added clock cycles allow pulsing added clocks, thereby increasing fault coverage per test pattern.

In one method using the embodiments, the ATPG selects as many clocks as possible, choosing pattern cycles to void unnecessary faults or disturbances. The synchronous OCC if defined is considered for disturbances and transition test credits. ATPG selects clocks with the highest past interval fault detection. The stuck-at fault model with increased XLBIST detection is, thus, supported by the expanded testing in the ATPG. Also further XLBIST transition fault model detection is supported by the expanded stuck-at ATPG test capability.

FIG. 1 provides a block diagram showing system components according to some embodiments described herein. FIG. 1 includes a SoC 100 that includes logic 102 for which on-chip testing is provided in the form of an LBIST 104. An automatic test pattern generator (ATPG) 120 can be included offboard of the SoC to generate test patterns as well as clocking used for the test patterns that are provided to the LBIST for testing the logic. However as an alternative, the ATPG 120 (an associated components) could likewise be provided onboard the SoC 100.

The logic 102 on the SoC 100 receives functional logic inputs separate from the test system and provides outputs as shown in FIG. 1. A system clock 106 located on the SoC 100 provides clocking to the logic 102 during functional operation of the logic 102 separate from testing. During normal functional operation, separate from testing, the LBIST system does not send signals to the logic 102.

The LBIST 104 includes its own test clocks 108 that are provided to the logic 102 during testing. The test clocks 108 operate usually within a single clock cycle of the system clock 106, but may operate across multiple system clock cycles during testing. The LBIST 104 functions to provide a test pattern to inputs of the logic along with the test clock signals and then monitors the results of testing as received from the logic.

To accomplish testing, the LBIST 104 is controlled by a test control processor or on chip controller (OCC) 110 provided within the LBIST 104. The processor 110 is connected to a memory 112 that provides code that enables the processor to control testing. Although the processor 110 and memory 112 are shown to be included on the SoC 100 as part of the LBIST 104, the processor 110 and memory 112 can be located offboard the SOC 100, and potentially included in the ATPG 120.

As shown, the ATPG 120 provides test patterns as well as clock control signals for both applying the clocks and controlling test clock pulses during testing. The test pattern from the ATPG 120 goes to the LBIST 104 and is provided to the logic 102 being tested. The test results as obtained from the logic are then obtained by the LBIST 104. Analysis of the test results is provided by the LBIST 104. In one embodiment, a golden standard for the expected test results is stored in the LBIST 104 and compared with the test results received to determine faults of errors within the logic 102.

One of the main challenges for LBIST is that unknown input or output values (Xs) can affect the test result by masking observation and effectively corrupting the output response. As an example of an unknown X input, assume that an AND logic gate has two inputs, an A input and a B input, as well as an output. With A and B both being a 1, the output will be 1, but if either of A or B is 0 then the output will be 0. Suppose that A is 1 but for some reason B is unknown. Then the output could be either a 0 or 1 depending on the actual value of B. However, if A is 0, it doesn't matter what the value of B is either 0 or 1, the output of the logic AND gate will be 0.

One way for an "unknown" value to occur is for the clocking of a signal providing the A or B inputs to the AND gate to transition during the system clock capture cycle. For example, if A is 1 and B (during the system clock capture cycle) transitions during the clock capture cycle from a 0 to a 1, then (i) during part of the clock capture cycle B can have a value of 0 and the output will be 0 and (ii) during part of the clock capture cycle B can transition to a value of 1 and the output will be 1. Thus, testing of the output of the AND gate during the beginning of the clock capture cycle will be different than at the end of the clock capture cycle. Thus, the B input to the AND gate is an unknown X value.

There can be multiple sources of Xs. Although some Xs can be detected based on a design of the logic and can be identified to create more accurate test results, the Xs are often difficult to fix in a way that does not impact timing, power or design schedule.

XLBIST is one LBIST architecture that is capable of supporting Xs occurring during testing. The XLBIST can also have an X-tolerant mechanism that inhibits many unwanted Xs from propagating to the outputs.

The XLBIST test patterns from an ATPG can include multiple intervals. Each interval can include test patterns, a set of clocks, the number of patterns in a test interval and the expected logic outputs. The patterns in an interval apply clocks as determined by a clock-control chain loaded at the beginning of the interval. The on-chip XLBIST controller, such as processor controller 110 (e.g. test control processor) of FIG. 1 determines when tests, such as test clocks 108 of FIG. 1, are applied by enabling a path from a phase locked loop (PLL) providing the clock to the root of a clock tree providing the clock to multiple portions of the logic being tested. A test interval can apply a subset of clocks so multiple intervals can be required to test all the potential clock domain possibilities.

An LBIST or an XLBIST test method is provided in embodiments described herein. The test method controls application of multiple test system clock signals applied from an LBIST to logic during a system clock capture cycle. Further, a timing of an application of clock cycle pulses of the selected multiple test system clocks of the LBIST system is provided to the logic during the system clock capture cycle. Control of timing of application of the clock cycle pulses allows for staggering of pulses of individual clocks applied during testing to eliminate cross domain clock errors resulting in clock disturb conditions.

Embodiments further include clock selection of a primary clock and secondary clocks. The primary clock and secondary clock selection takes into account first what test clocks were successfully used in previous tests. The primary and secondary clocks further take into account clocks where a significant number of disturbs occur to allow for elimination of test clocks that cause such disturb conditions. Selection of the primary and secondary clocks are described in more detail to follow.

Figure 2:
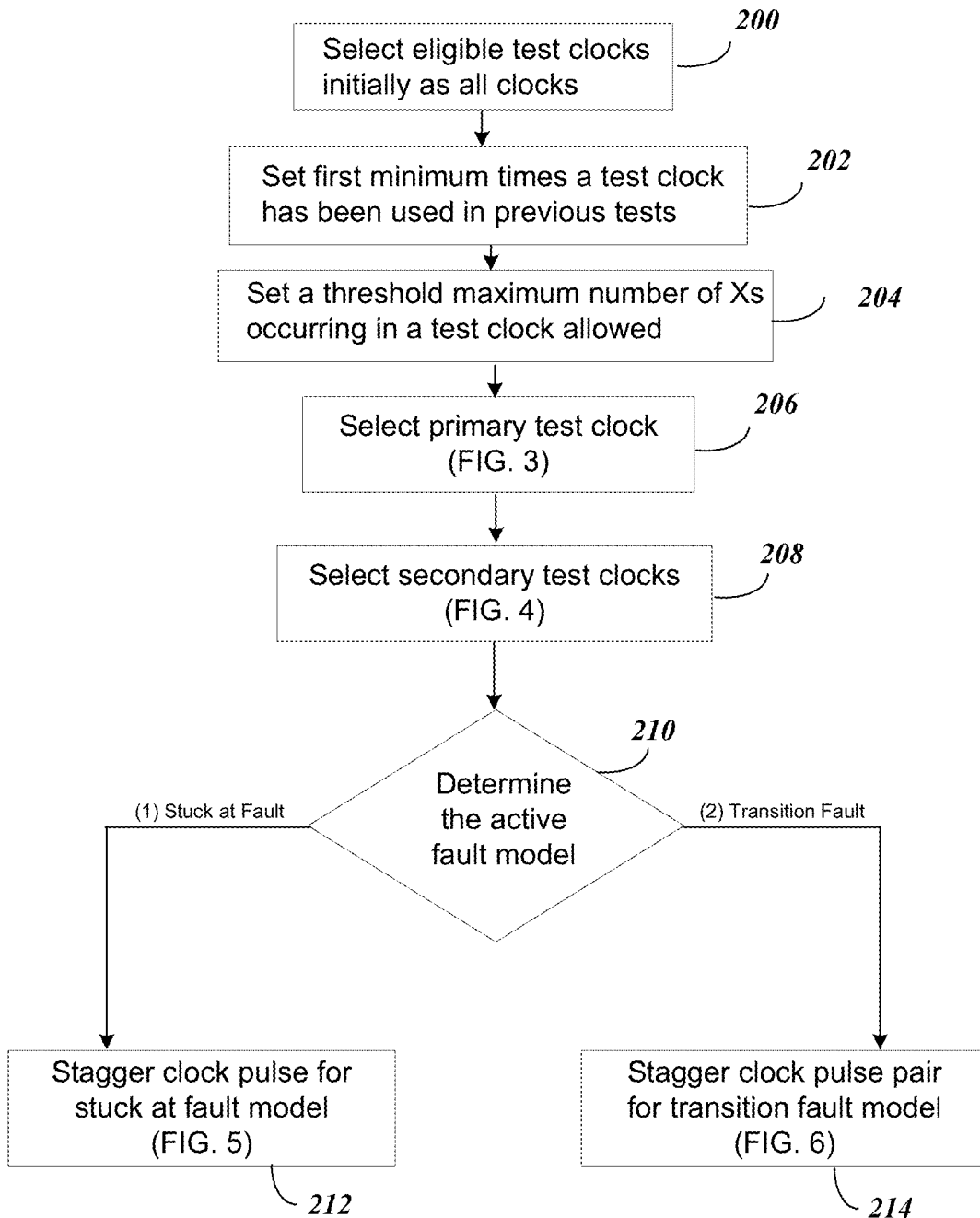
FIG. 2 shows a flow diagram illustrating operations for selection of test clocks and timing of application of test clock cycles for an LBIST system according to some embodiments of the present disclosure.

FIG. 2 shows a flow diagram illustrating operations for selection of test clocks and timing of application of test clock cycles for an LBIST system according to some embodiments of the present disclosure. The flow diagram of FIG. 2 begins with operation 200 that includes identifying (selecting) all eligible test clocks that can be initially used during logic testing. Next operation 202 sets a first minimum number of times a clock is selected (used) to indicate clocks that may be excluded in the future due to unacceptable faults occurring in clocks greater than the minimum. Note that the first minimum number can be recalculated periodically after multiple tests.

Further in operation 204 a threshold maximum number of Xs occurring for a test clock is determined. The maximum number Xs can be determined based on the ability of the LBIST or XLBIST to handle the Xs. The maximum number of Xs can also be set based on the ability of the features of embodiments described herein to not incur errors.

Note that the maximum Xs from operation 204 can be recalculated periodically after multiple tests to allow for more or less clocks to be used. The maximum X value selected can begin with a very high value (so no clocks are initially excluded). The max X value can then be adjusted every XLBIST test interval based on the average number of X-captures. Clocks which could capture many Xs are excluded because XLBIST X-blocking can also block non-X cells causing collateral damage.

In the subsequent operations of FIG. 2, test clocks are selected for the LBIST system and a determination is made on whether to stagger the test clocks to prevent disturb conditions from affecting test results. Specifically, in operation 206 a primary test clock is first selected. A detailed flow diagram showing operations for selection of the primary clock is provided in FIG. 3. Secondary test clocks are selected in operation 208 up to a maximum number of available test clocks. A detailed flow diagram showing operations for selection of secondary clocks is provided in FIG. 4.

Further operations of FIG. 2 provide for staggering test pulses of selected test clocks to prevent disturb conditions during a fault model. Specifically, in operation 210, a selected test clock pulse is evaluated to determine an active fault model. Staggering of pulses is then performed to prevent a disturb depending on whether the fault model is a stuck at fault model or a transition fault model. If the stuck at fault model is active as determined in operation 210 then in operation 212 an evaluation is performed to determine if staggering of pulses should be performed for the stuck at fault model. Determining if staggering should be provided for a stuck at fault is described in detail in FIG. 5. If the transition model is active as determined in operation 210 then in operation 214 an evaluation is performed to determine if staggering of pulses should be performed for the transition fault model. Determining if staggering should be provided for a transition fault is described in detail in FIG. 6.

Figure 3:
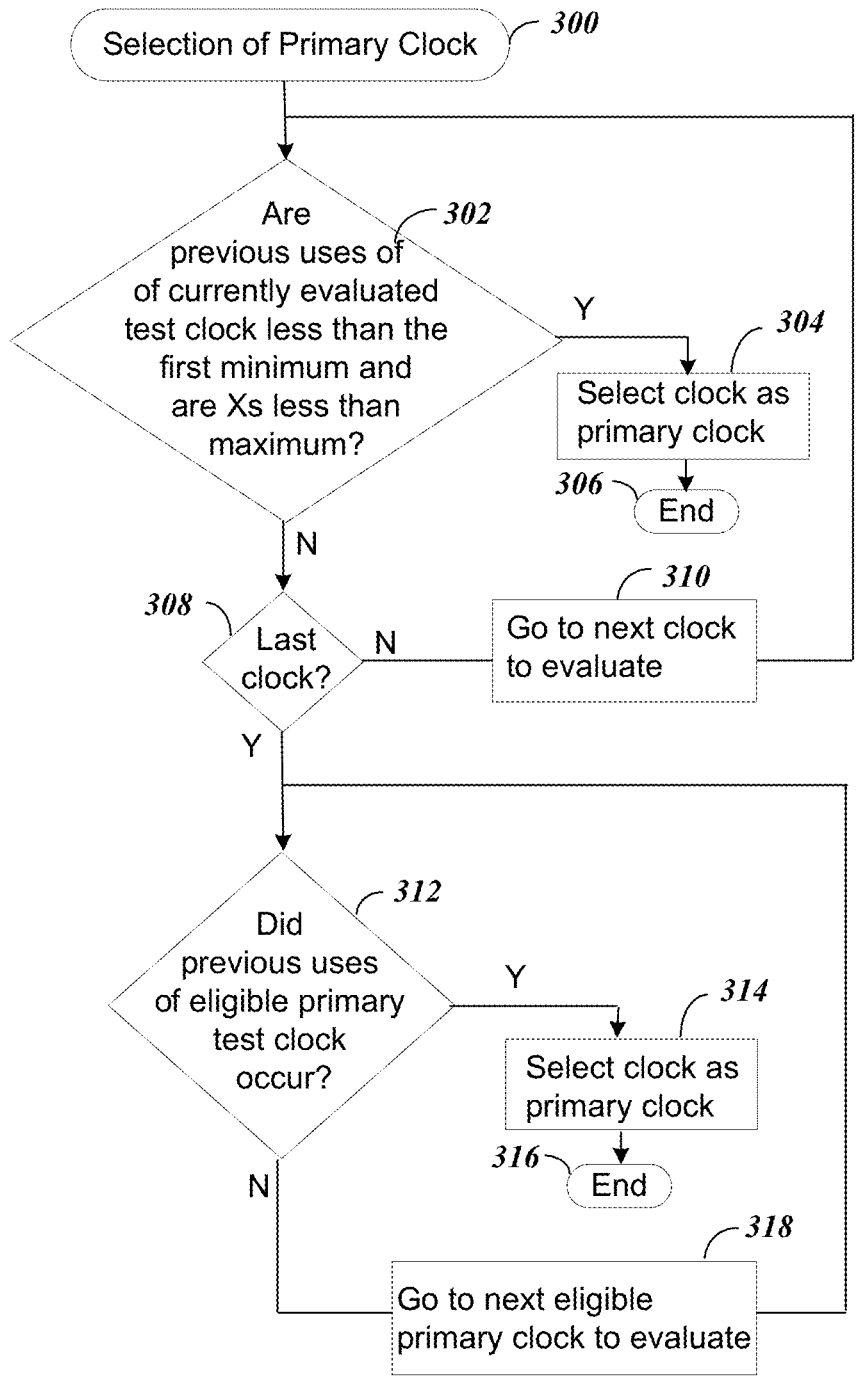
FIG. 3 shows a flow diagram illustrating selection of a primary test clock according to some embodiments of the present disclosure.

FIG. 3 is a flow diagram illustrating various operations performed for selecting the primary test clock according to some embodiments of the present disclosure. The primary test clock is chosen in the process which starts at 300 to reduce errors due to disturb conditions occurring in the logic during testing. In operation 302, a first loop process is initiated to determine for each eligible test clock if the test clock can be selected as a primary clock. Operation 302 determines whether a previous use of the current test clock being evaluated is less than the first minimum selected number of times (e.g., the first minimum being previously determined in operation 202 of FIG. 2). Further, operation 302 determines for the current test clock being evaluated whether excessive Xs have occurred by looking at whether Xs have occurred less than a maximum threshold for the test clock being evaluated. If both determinations of operation 302 true (i.e., yes), then operation 304 is performed to select the clock as the primary clock and the primary clock selection ends in operation 304.

If any of the determinations of operation 302 are false (i.e., no), then operation 308 is performed. Operation 308 determines if this is the last clock pulse to evaluate and if so, the process proceeds to the next loop beginning at operation 312. If this is not the last clock pulse as determined in operation 308, the process proceeds to operation 310 where the next test clock for evaluation is selected and the process returns to operation 302 to evaluate the next test clock.

The second loop beginning at operation 312 sets the primary clock if no primary clock is selected in the first loop beginning at operation 302. After the first loop where no primary clock is selected, the eligible clocks have all been checked. Thus, all of them exceeded the first minimum. With the second loop reached in operation 312 the first minimum will be removed and the eligible clocks will again be evaluated. In this second loop, the eligible clocks are evaluated to determine if they were previously used in operation 312. If so, as determined in operation 312, in operation 314 the eligible clock is selected as the primary clock and the process ends in operation 316. If not as determined in operation 312 in operation 318 the next eligible clock is selected and operation of the second loop proceeds back to operation 312 until an eligible test clock previously used is selected as the primary clock.

Figure 4:
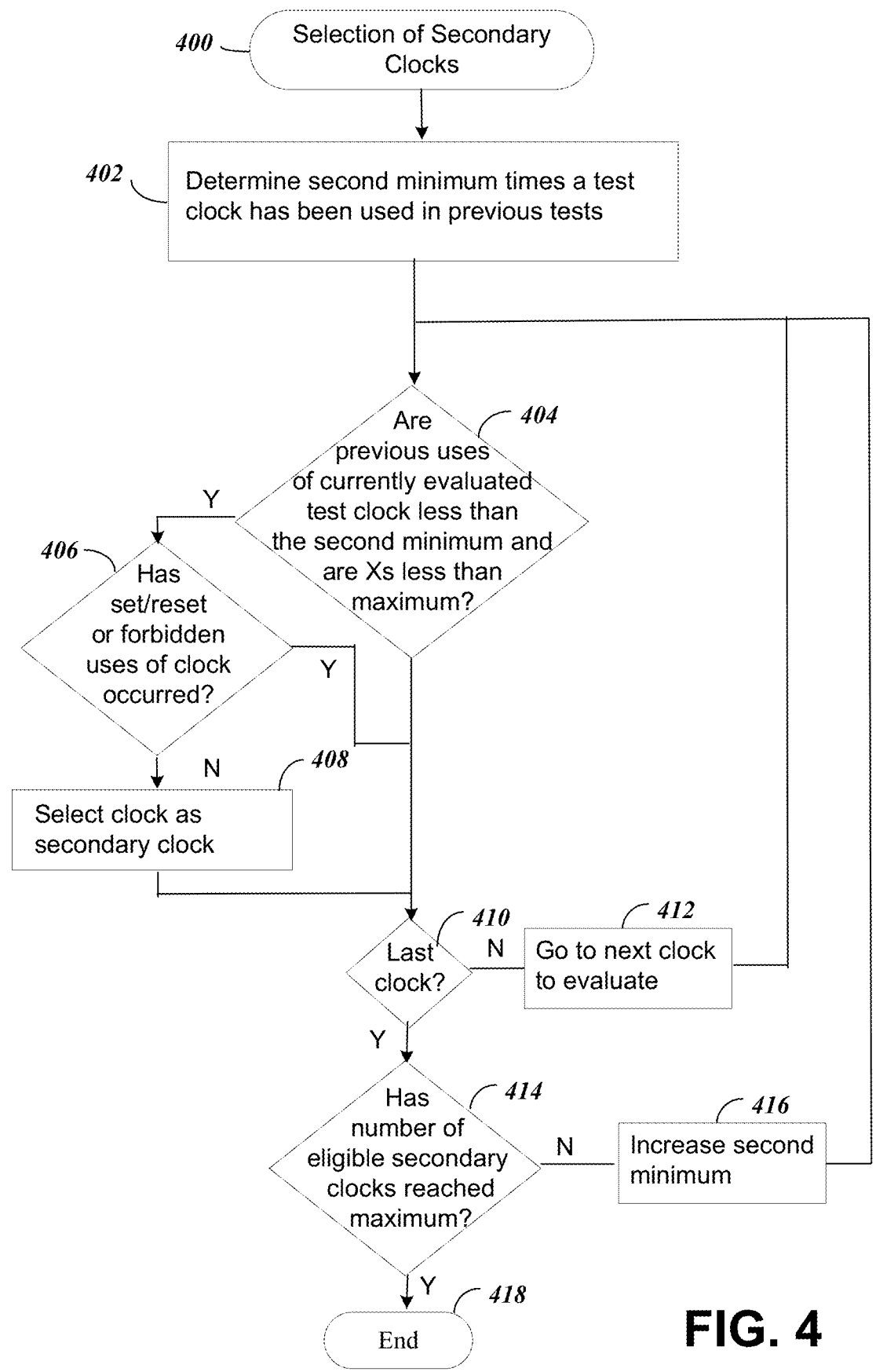
FIG. 4 shows a flow diagram illustrating selection of secondary test clocks according to some embodiments of the present disclosure.

FIG. 4 is a flow diagram illustrating selection of secondary test clocks according to some embodiments of the present disclosure. The secondary test clocks are clocks optionally chosen to add to the primary clock when additional clocks are desirable to provide logic test results. Like the primary clock, the secondary clocks are excluded due to creating too many Xs.

The process for secondary clock selection begins at 400. In operation 402 a second minimum number of times a test clock has been selected in previous tests is set, with the second minimum number being used to determine the secondary clocks. Next, a first loop begins with operation 404 with a first loop where selection of eligible secondary clocks is performed to evaluate remaining test clocks not selected as the primary clock for inclusion as secondary clocks. Specifically, in operation 404 (for each eligible test clock other than the primary clock) a determination is made of whether each test clock is below the second minimum selected in operation 402. Further in operation 404 it is determined whether excessive Xs have occurred by looking at whether Xs are less than a maximum threshold for the clock evaluated. If both of the determinations performed by operation 404 are both true (e.g., yes), then the process proceeds to operation 406. If any of the determinations of operation 404 false (e.g., no), then the process proceeds to operation 410 to determine whether the current test clock evaluated is the last clock for evaluation.

Operation 406 evaluates whether the test clock has encountered a set/reset operation or whether forbidden uses of the test clock have recently occurred. Once a set/reset occurs faults may not be identifiable based on previous uses of the clock, so test errors resulting from using the set/reset clocks can be uncertain. Further, if the system is transitioning to a different series of test patterns, the transition faults in set/reset clocks may not be readily removed, which is another reason to exclude the set/reset clocks if there are other adequate clocks available. If no such set/reset clock occurs in as determined in operation 406, then the clock is selected as an eligible test clock in operation 408 and the process proceeds to determine if this is the last clock to evaluate for inclusion in secondary clocks in in operation 410. If a set/reset or forbidden operation occurs in operation 406, then the clock is not selected and operation proceeds to the last clock evaluation in operation 410.

The last clock evaluation operation 410 determines if this is the last clock pulse to evaluate for inclusion in secondary clocks. If so, then the process proceeds to a further evaluation operation 414. If this is not the last clock pulse for evaluation, then the process proceeds to operation 412 to go to the next test clock for evaluation and then returns to operation 404 to evaluate the additional test clock.

Operation 414 evaluates if the number of secondary clocks selected has reached a maximum number of test clocks available for use. If the number of secondary clocks has not reached the maximum number, then the process proceeds to operation 416, according to which the second minimum is raised and the process returns to operation 404 to reevaluate potential test clocks for inclusion in the secondary clocks. If the number of secondary clocks in operation 414 has reached the maximum, then selection of secondary test clocks is complete and the process ends at 418.

Figure 5:
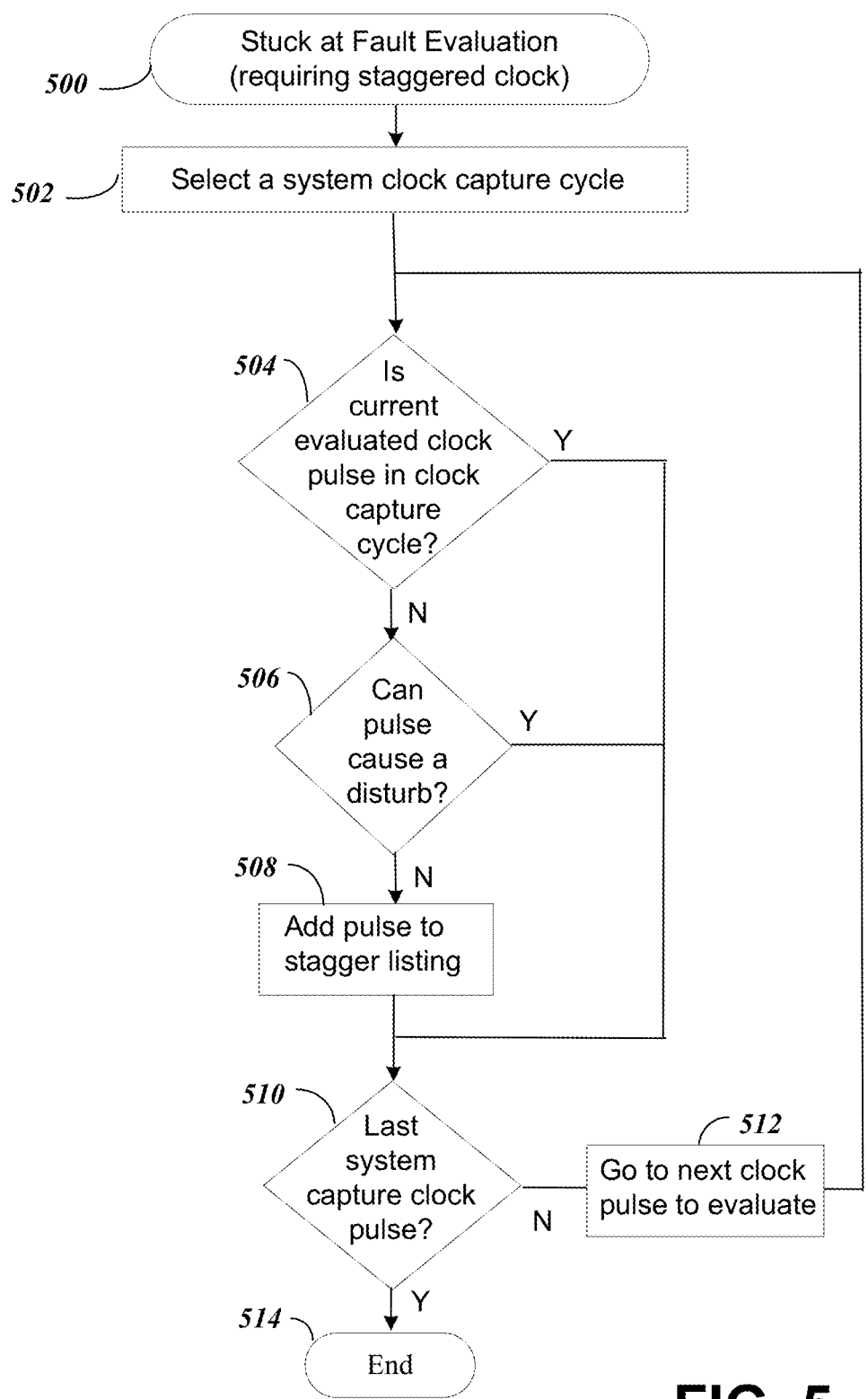
FIG. 5 shows a flow diagram illustrating staggering of test clock pulses to prevent unknown values in a stuck at fault model condition according to some embodiments of the present disclosure.
Figure 6:
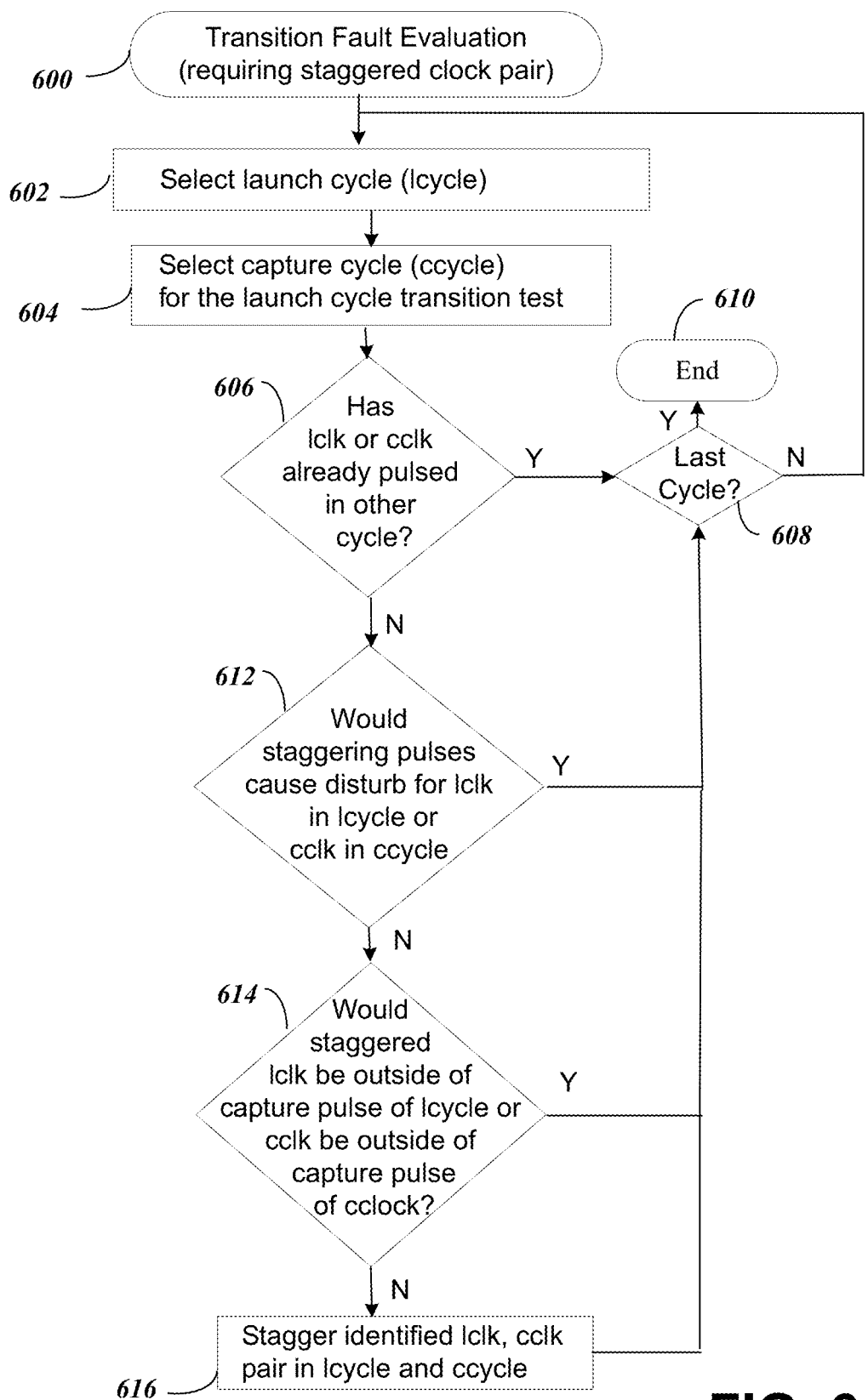
FIG. 6 shows a flow diagram illustrating staggering a pair of test clock pulses during a transition fault model according to some embodiments of the present disclosure.

With selection of primary and secondary test clocks complete, FIGS. 5 and 6 provide flow diagrams evaluating the possibility of staggering pulses in the test clocks to further prevent disturb Xs from occurring. Staggering of pulses of the test clocks can be done within a system clock capture cycle to prevent disturbs and otherwise reduce the number of Xs. In general, staggering clocks reduces the number of Xs. More test clocks can be applied without disturbs if clock pulse staggering is used. However, staggering clocks, particularly across two system clock capture cycles presents a trade-off between increasing the functional captures and increasing Xs. Clocks which cause disturbs when applied in the same capture cycle can be staggered to eliminate disturbs Xs using the process of either FIG. 5 or FIG. 6.

FIG. 5 shows a flow diagram illustrating a process for staggering of test clock pulses to prevent unknown values for stuck at fault test patterns according to some embodiments of the present disclosure. The process of FIG. 5 for evaluation of staggering clock pulses for stuck at fault model begins at 500. Operation 502 includes selecting a clock capture cycle during which test clocks selected as primary and secondary clocks in FIGS. 3 and 4 will be pulsed. This process to evaluate pulses of individual test clocks beginning with operation 504 beginning a loop where each pulse occurring during a clock capture cycle is individually evaluated.

Specifically, operation 504 includes determining whether the pulse occurs during the clock capture cycle where test clock pulses are provided. If operation 504 determines that the pulse being evaluated does occur during the clock capture cycle, then the process proceeds to operation 510 to evaluate other pulses of the test clocks if this is not the last pulse to evaluate. If operation 504 determines that the pulse evaluated does not occur during the clock capture cycle, then the process proceeds to operation 506. Operation 506 determines if the clock pulse could cause a disturb condition. As indicated above, such disturb conditions could result from a stuck at fault where two different selected test clocks are pulsed closed together during a capture cycle. If operation 506 determines that the clock pulse could not cause a disturb condition, then operation 508 adds the pulse to a list for staggering, and the process proceeds to operation 510 to evaluate other pulses if this not the last pulse. If operation 506 determines that the clock pulse would cause a disturb condition, then the pulse is not added to the list for staggering and the process proceeds to operation 510 for evaluation of further pulses. In operation 510 if the last pulse has not been evaluated in the clock capture cycle, the process goes to operation 512 where a next clock pulse is selected for evaluation and operation proceeds back to 504 to evaluate the additional pulse. If operation 510 determines that the last clock pulse has been evaluated, then the process ends at 514.

FIG. 6 shows a flow diagram illustrating another method for staggering a pair of clock pulses in accordance with some embodiments of the present disclosure during a transition fault model due to a clock test pulse potentially occurring across two clock capture cycles. The process illustrated in FIG. 6 determines if clock pairs should be staggered to avoid transition faults and begins at 600. The process goes through individual test operations and evaluates two separate clock cycles for each test operation. First a launch cycle (lcycle) is provided where test clock pulses are provided or launched as launch clocks (lclk). And second, capture clock cycles (ccycle) are provided where the system clock transitions to provide capture clocks (cclk) during testing. The process begins with operation 602 where a specific launch cycle (lcycle) is selected for evaluation. Further in operation 604, for the selected launch cycle (lcycle), a capture cycle (ccycle) is selected during which the lcycle occurs. After the selections in operations 602 and 604, the lclk and the cclk are ready for evaluation.

After the lcycle and ccycle cycles are set for evaluation, operation 606 determines whether one of the lcycle clock pulses (lclk) or ccycle clock pulses (cclk) has already pulsed in another cycle. If one of the lclk or cclk have pulsed in another cycle, there is little likelihood that the clock pulses will cause a disturb at a transition of either the launch cycle or the clock cycle, and with one clock pulsing there is little likelihood of the lclk or cclk pulses interfering to cause a disturb. Thus, if one of the lclk or cclk has already pulsed in another cycle, as determined according to operation 606, then no staggering is needed and the process proceeds to operation 608 to determine if other launch cycles and capture cycles should be evaluated or if these are the last cycles to evaluate. If operation 608 determines that these are the last cycles, then the process ends at 610. If operation 608 determines that these are not the last cycles to evaluate, then the process proceeds back to operation 602.

If operation 606 determines that neither the lclk or cclk has been pulsed in other cycles, then the process proceeds to operation 612 to further evaluate if staggering a pair of pulses is desirable. Specifically, operation 612 determines whether staggering would cause a disturb condition by pulsing the lclk in the lcycle or by pulsing the cclk in the ccycle. If operation 612 determines that the staggering will potentially cause a disturb condition, then the process proceeds back to operation 608, as described above. If operation 612 determines that the staggering will not cause the disturb condition, then the process proceeds to operation 614.

Operation 614 determines whether staggering of the lclk would move the lclk pulse outside of the lcycle or if staggering of the cclk would move the cclk pulse outside of the ccycle. If either is the case in operation 614, then staggering of the lclk and cclk would not be advantageous for the test operation in the ccycle or lcycle, so no staggering is performed and the process proceeds to operation 608, as described above. If neither of the lclk or cclk pulses would be outside of their cycle, as determined in operation 614, then the process proceeds to operation 616. Operation 616 staggers the lclk and cclk pulse pair. Once operation 616 performs the staggering, then the process proceeds to operation 608, as described above.

FIG. 7 provides two tables showing results of applying the XLBIST system according to some embodiments of the present disclosure. In the Tables I and II, test results for a first stuck-at fault model is shown. For a stuck at fault detection, individual signals and pins are assumed to be stuck at logical 1, logical 0 and any resulting faults are detected. Further in Tables I and II, stuck-at and transition fault detection results are also shown. Transition faults are faults that are detected during a transition of logic from 0-1 or 1-0 and whether the transition occurs in a specific time designated.

The results in Tables I and II are provided for two different logic structures, labeled "Design A" and "Design B." Results are provided for different numbers of test pattern sequences ranging from 10 to 100 intervals. The results that are shown using embodiments described herein are indicated to have "Smart XLBIST" technology. Results also show where the "Smart XLBIST" technology not used. As shown, the test coverage results increase in percentage of detected faults using the "Smart XLBIST" technology of embodiments of the present disclosure. The values shown in Tables I and II, for example 81.73, indicate a percentage of correct fault determinations in test results with 81.73 indicating 81.73% of faults detected.

Turning back to FIG. 1, the processor 110 shown in FIG. 1, which can implement the operations of FIGS. 2-6, is not limited to a specific processing device, and the memory 112 of FIG. 1 is similarly not limited and may include a main memory 1004 (e.g., read-only memory (ROM), flash memory, dynamic random access memory (DRAM) such as synchronous DRAM (SDRAM), a static memory (e.g., flash memory, static random access memory (SRAM), etc.), and a data storage device. The processor 110 and memory 112 can communicate with each other via a bus.

Processing device 110 represents one or more processors such as a microprocessor, a central processing unit, or the like. More particularly, the processing device may be complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 110 may also be one or more special-purpose processing devices such as an application specific integrated circuit (ASIC), a field programmable gate array (FPGA), a digital signal processor (DSP), network processor, or the like. The processing device 110 may be configured to execute instructions for performing the operations and method operations described herein.

The memory 112 may include a machine-readable storage medium (also known as a non-transitory computer-readable medium) on which is stored one or more sets of instructions or software embodying any one or more of the methodologies or functions described herein. The instructions may also reside, completely or at least partially, within a main memory and/or within the processing device 110 during execution thereof by the processor 110. The main memory 112 and the processing device 110 together may constitute machine-readable storage media.

In some implementations, the instructions include instructions to implement functionality corresponding to the present disclosure. While the machine-readable storage medium can be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine and the processing device 110 to perform any one or more of the methodologies of the present disclosure. The term "machine-readable storage medium" shall accordingly be taken to include, but not be limited to, solid-state memories, optical media, and magnetic media.

Figure 8:
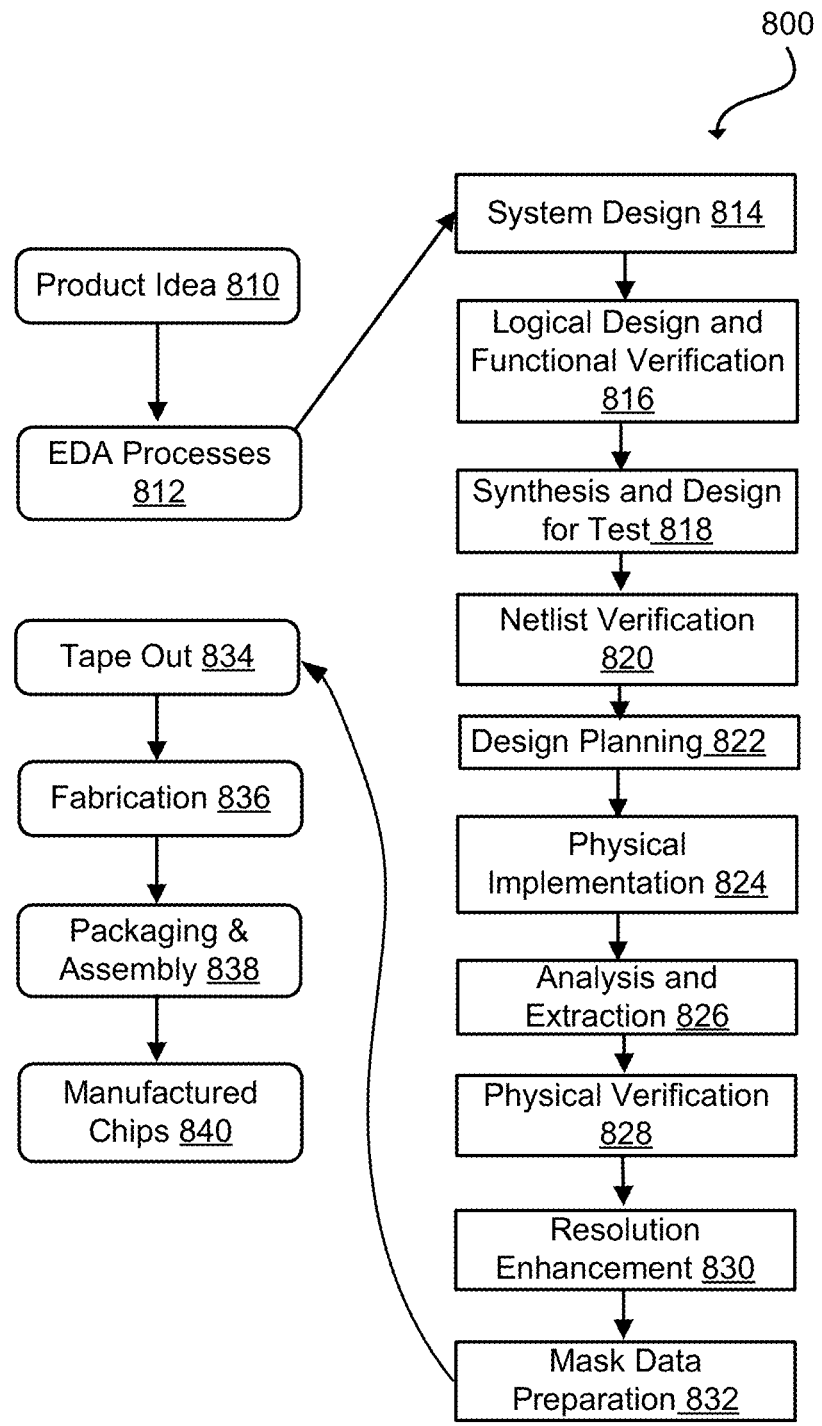
FIG. 8 depicts a flowchart of various processes used during the design and manufacture of an integrated circuit in accordance with some embodiments of the present disclosure.

FIG. 8 illustrates an example set of processes FIGS. 2-6 used during the design, verification, and fabrication of an article of manufacture such as an integrated circuit to transform and verify design data and instructions that represent the integrated circuit. Such processes illustrated in FIG. 8 can use the LBIST of the present disclosure to ensure the functionality of logic during design. Each of these processes can be structured and enabled as multiple modules or operations. The term 'EDA' signifies the term 'Electronic Design Automation.' These processes start with the creation of a product idea 810 with information supplied by a designer, information which is transformed to create an article of manufacture that uses a set of EDA processes 812. When the design is finalized, the design is taped-out 834, which is when artwork (e.g., geometric patterns) for the integrated circuit is sent to a fabrication facility to manufacture the mask set, which is then used to manufacture the integrated circuit. After tape-out, a semiconductor die is fabricated 836 and packaging and assembly processes 838 are performed to produce the finished integrated circuit 840.

Specifications for a circuit or electronic structure may range from low-level transistor material layouts to high-level description languages. A high-level of representation may be used to design circuits and systems, using a hardware description language ('HDL') such as VHDL, Verilog, SystemVerilog, SystemC, MyHDL or OpenVera. The HDL description can be transformed to a logic-level register transfer level ('RTL') description, a gate-level description, a layout-level description, or a mask-level description. Each lower representation level that is a more detailed description adds more useful detail into the design description, for example, more details for the modules that include the description. The lower levels of representation that are more detailed descriptions can be generated by a computer, derived from a design library, or created by another design automation process. An example of a specification language at a lower level of representation language for specifying more detailed descriptions is SPICE, which is used for detailed descriptions of circuits with many analog components. Descriptions at each level of representation are enabled for use by the corresponding systems of that layer (e.g., a formal verification system). A design process may use a sequence depicted in FIG. 8. The processes described by be enabled by EDA products (or EDA systems).

During system design 814, functionality of an integrated circuit to be manufactured is specified. The design may be optimized for desired characteristics such as power consumption, performance, area (physical and/or lines of code), and reduction of costs, etc. Partitioning of the design into different types of modules or components can occur at this stage.

During logic design and functional verification 816, modules or components in the circuit are specified in one or more description languages and the specification is checked for functional accuracy. For example, the components of the circuit may be verified to generate outputs that match the requirements of the specification of the circuit or system being designed. Functional verification may use simulators and other programs such as testbench generators, static HDL checkers, and formal verifiers. In some embodiments, special systems of components referred to as 'emulators' or 'prototyping systems' are used to speed up the functional verification.

During synthesis and design for test 818, HDL code is transformed to a netlist. In some embodiments, a netlist may be a graph structure where edges of the graph structure represent components of a circuit and where the nodes of the graph structure represent how the components are interconnected. Both the HDL code and the netlist are hierarchical articles of manufacture that can be used by an EDA product to verify that the integrated circuit, when manufactured, performs according to the specified design. The netlist can be optimized for a target semiconductor manufacturing technology. Additionally, the finished integrated circuit may be tested to verify that the integrated circuit satisfies the requirements of the specification.

During netlist verification 820, the netlist is checked for compliance with timing constraints and for correspondence with the HDL code. During design planning 822, an overall floor plan for the integrated circuit is constructed and analyzed for timing and top-level routing.

During layout or physical implementation 824, physical placement (positioning of circuit components such as transistors or capacitors) and routing (connection of the circuit components by multiple conductors) occurs, and the selection of cells from a library to enable specific logic functions can be performed. As used herein, the term 'cell' may specify a set of transistors, other components, and interconnections that provides a Boolean logic function (e.g., AND, OR, NOT, XOR) or a storage function (such as a flipflop or latch). As used herein, a circuit 'block' may refer to two or more cells. Both a cell and a circuit block can be referred to as a module or component and are enabled as both physical structures and in simulations. Parameters are specified for selected cells (based on 'standard cells') such as size and made accessible in a database for use by EDA products.

During analysis and extraction 26, the circuit function is verified at the layout level, which permits refinement of the layout design. During physical verification 828, the layout design is checked to ensure that manufacturing constraints are correct, such as DRC constraints, electrical constraints, lithographic constraints, and that circuitry function matches the HDL design specification. During resolution enhancement 830, the geometry of the layout is transformed to improve how the circuit design is manufactured.

During tape-out, data is created to be used (after lithographic enhancements are applied if appropriate) for production of lithography masks. During mask data preparation 832, the 'tape-out' data is used to produce lithography masks that are used to produce finished integrated circuits.

Figure 9:
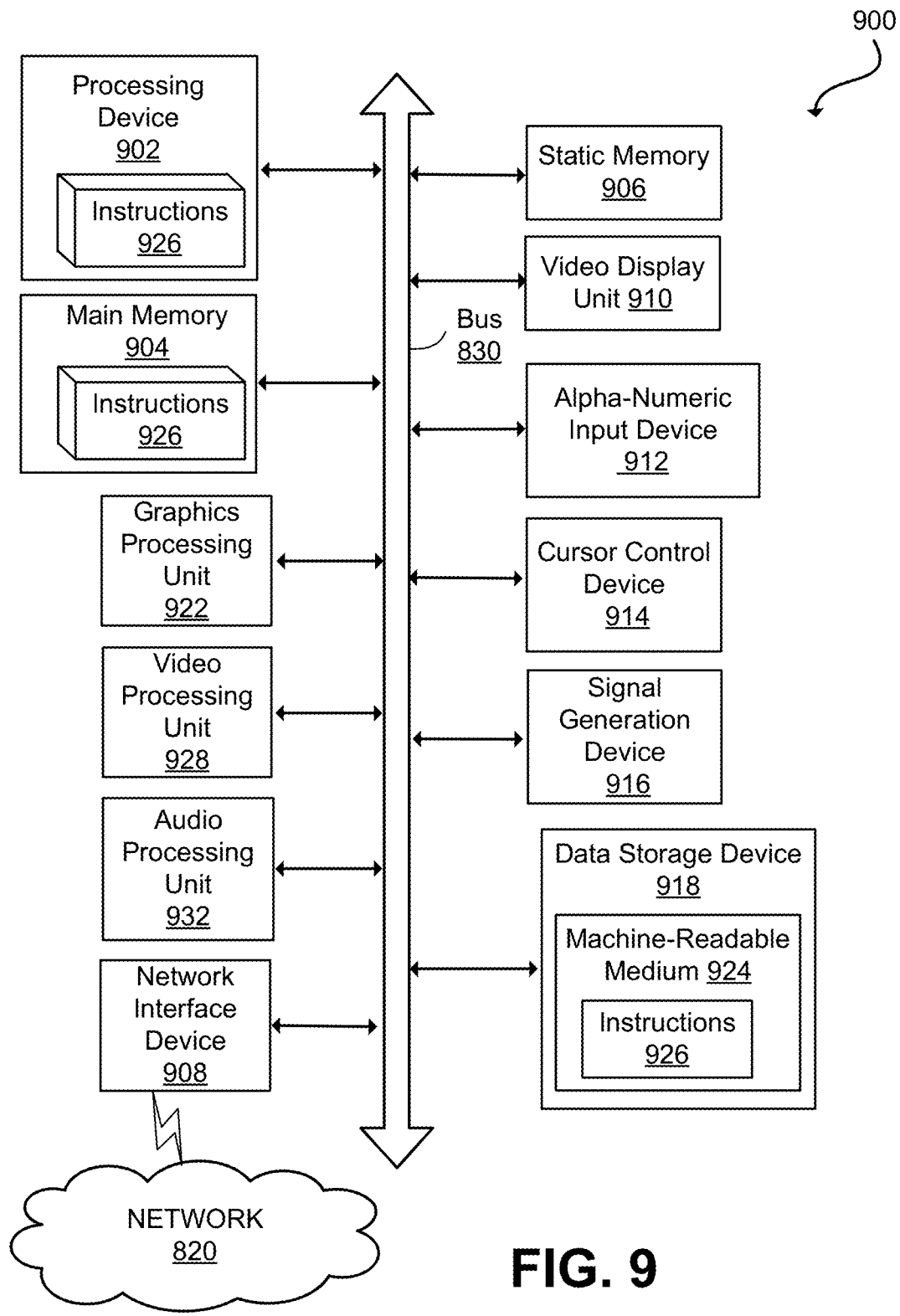
FIG. 9 depicts a diagram of an example computer system in which embodiments of the present disclosure may operate.

FIG. 9 illustrates an example machine of a computer system 900 within which a set of instructions, for causing the machine to perform any one or more of the methodologies discussed herein, may be executed. In alternative implementations, the machine may be connected (e.g., networked) to other machines in a LAN, an intranet, an extranet, and/or the Internet. The machine may operate in the capacity of a server or a client machine in client-server network environment, as a peer machine in a peer-to-peer (or distributed) network environment, or as a server or a client machine in a cloud computing infrastructure or environment.

The machine may be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 900 includes a processing device 902, a main memory 904 (e.g., read-only memory (ROM), flash memory, dynamic random access memory (DRAM) such as synchronous DRAM (SDRAM), a static memory 906 (e.g., flash memory, static random access memory (SRAM), etc.), and a data storage device 918, which communicate with each other via a bus 930.

Processing device 902 represents one or more processors such as a microprocessor, a central processing unit, or the like. More particularly, the processing device may be complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 902 may also be one or more special-purpose processing devices such as an application specific integrated circuit (ASIC), a field programmable gate array (FPGA), a digital signal processor (DSP), network processor, or the like. The processing device 902 may be configured to execute instructions 926 for performing the operations described herein.

The computer system 900 may further include a network interface device 908 to communicate over the network 920. The computer system 900 also may include a video display unit 910 (e.g., a liquid crystal display (LCD) or a cathode ray tube (CRT)), an alphanumeric input device 912 (e.g., a keyboard), a cursor control device 914 (e.g., a mouse), a graphics processing unit 922, a signal generation device 916 (e.g., a speaker), graphics processing unit 922, video processing unit 928, and audio processing unit 932.

The data storage device 918 may include a machine-readable storage medium 924 (also known as a non-transitory computer-readable medium) on which is stored one or more sets of instructions 926 or software embodying any one or more of the methodologies or functions described herein. The instructions 926 may also reside, completely or at least partially, within the main memory 904 and/or within the processing device 902 during execution thereof by the computer system 900, the main memory 904 and the processing device 902 also constituting machine-readable storage media.

In some implementations, the instructions 926 include instructions to implement functionality corresponding to the present disclosure. While the machine-readable storage medium 924 is shown in an example implementation to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine and the processing device 902 to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm may be a sequence of operations leading to a desired result. The operations are those requiring physical manipulations of physical quantities. Such quantities may take the form of electrical or magnetic signals capable of being stored, combined, compared, and otherwise manipulated. Such signals may be referred to as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the present disclosure, it is appreciated that throughout the description, certain terms refer to the action and processes of a computer system, or similar electronic computing device, that manipulates and transforms data represented as physical (electronic) quantities within the computer system's registers and memories into other data similarly represented as physical quantities within the computer system memories or registers or other such information storage devices.

The present disclosure also relates to an apparatus for performing the operations herein. This apparatus may be specially constructed for the intended purposes, or it may include a computer selectively activated or reconfigured by a computer program. Such a computer program may be stored in a computer readable storage medium, such as, but not limited to read-only memories (ROMs), random access memories (RAMs), EPROMS, EEPROMs or any type of media suitable for storing electronic instructions, each coupled to a computer system bus.

The algorithms and displays presented herein are not inherently related to any particular computer or other apparatus. Various other systems may be used with programs in accordance with the teachings herein, or it may prove convenient to construct a more specialized apparatus to perform the method. In addition, the present disclosure is not described with reference to any particular programming language. It will be appreciated that a variety of programming languages may be used to implement the teachings of the disclosure as described herein.

The present disclosure may be provided as a computer program product, or software, that may include a machine-readable medium having stored thereon instructions, which may be used to program a computer system (or other electronic devices) to perform a process according to the present disclosure. A machine-readable medium includes any mechanism for storing information in a form readable by a machine (e.g., a computer). For example, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

In the foregoing disclosure, implementations of the disclosure have been described with reference to specific example implementations thereof. It will be evident that various modifications may be made thereto without departing from the broader spirit and scope of implementations of the disclosure as set forth in the following claims. Where the disclosure refers to some elements in the singular tense, more than one element can be depicted in the figures and like elements are labeled with like numerals. The disclosure and drawings are, accordingly, to be regarded in an illustrative sense rather than a restrictive sense.

What is claimed is:
1. A method for testing logic comprising:
providing multiple test system clocks, from a logic built in self-test (LBIST) system that tests the logic, to the logic during a system clock capture cycle of a system clock during testing of the logic, wherein the system clock is separate from the multiple test system clocks of the LBIST system; and controlling a timing of an application of clock cycles of the multiple test system clocks of the LBIST system provided to the logic during the system clock capture cycle.

2. The method of claim 1, wherein the controlling of the timing of the application of the clock cycles comprises pulsing a number of clocks of the multiple test system clocks of the LBIST system during the system clock capture cycle.

3. The method of claim 2, wherein the controlling of the timing of the application of the clock cycles comprises staggering pulses of the number of clocks of the multiple test system clocks of the LBIST system during the system clock capture cycle.

4. The method of claim 1, further comprising:
creating test patterns using an automatic test pattern generator (ATPG) during the testing of the logic.

5. The method of claim 1, wherein the LBIST system is an unknown (X) tolerant XLBIST system, wherein the unknown (X) occurs when an output state of a logic gate being at a 0 or a 1 is unknown when testing the logic.

6. The method of claim 5, wherein the providing of the multiple test system clocks from the LBIST system comprises selecting a primary clock to be included in the multiple test system clocks comprising:
selecting, as the primary clock, a clock of the multiple test system clocks of the LBIST system that has been used less than a first set minimum number of times in previous system clock capture cycles where the LBIST system was applied; and
excluding, from the primary clock, clocks of the multiple test system clocks applied in the previous system clock capture cycles of the LBIST system in which unknowns (Xs) occurred more than a threshold number of times.

7. The method of claim 6, wherein the providing of multiple test system clocks from the LBIST system further comprises selecting secondary clocks, the selecting of the secondary clocks including:
selecting, as the secondary clocks, clocks of the multiple test system clocks of the LBIST system that have been used less than a second set minimum number of times in previous system clock capture cycles where the LBIST system was applied; and
excluding, from the secondary clocks, clocks of the multiple test system clocks applied in the previous system clock capture cycles of the LBIST system in which the unknowns (Xs) occurred more than the threshold number of times.

8. The method of claim 7, wherein the selecting of the secondary clocks further comprises:
excluding, from the secondary clocks, clocks which have been set or reset.

9. The method of claim 5, wherein the controlling of the timing of the application of the clock cycles comprises:
staggering a pulse of one of a number of clocks of multiple test system clocks during the system clock capture cycle so that the staggered pulse limits disturb cells, wherein the disturb cells occur in the logic that receives inputs clocked by two different ones of the multiple test system clocks causing different outputs of the logic during the system clock capture cycle.

10. The method of claim 9, wherein the controlling of the timing of the application of the clock cycles of the multiple test system clocks comprises:

staggering a pair of clocks which can cause the disturb cells when applied in a same capture cycle so that the staggered pair of clocks limit the disturb cells.

11. The method of claim 10, wherein the pair of staggered clocks include a clock in the multiple test system clocks in a test launch cycle and a system clock in the system clock capture cycle.

12. A system for testing logic on a system on a chip (SoC) comprising:
a logic built in self-test (LBIST) system that tests the logic:
a system clock provided to the logic that provides a clock capture cycle during testing of the logic:
multiple test system clocks that are provided to the LBIST system, wherein the multiple test system clocks are provided separate from the system clock during a system clock capture cycle applied for testing of the logic; and
test system clock control circuitry to:
provide the multiple test system clocks from the LBIST system to the logic during a system clock capture cycle of a system clock during testing of the logic; and
control a timing of an application of clock cycles of the multiple test system clocks of the LBIST system provided to the logic during the system clock capture cycle.

13. The system of claim 12, further comprising:
automatic test pattern generation (ATPG) circuitry that provides test patterns to the logic during testing of the logic.

14. The system of claim 12, wherein the LBIST system is an unknown (X) tolerant XLBIST system, wherein the unknown (X) occurs when an output state of a logic gate being at a 0 or a 1 is unknown when testing the logic.

15. The system of claim 12, wherein the test system clock control circuitry further controls the timing of the application of the clock cycles of the multiple test system clocks by staggering pulses of a limited number of the multiple test system clocks during the system clock capture cycle.

16. The system of claim 12, wherein the test system clock control circuitry further controls the providing of the multiple test system clocks from the LBIST system by selecting a primary clock to be included in the multiple clocks by:
selecting, as the primary clock, a clock of the multiple test system clocks of the LBIST system that has been used less than a first set minimum number of times in previous system clock capture cycles where the LBIST system has been applied; and
excluding, from the primary clock, clocks of the multiple test system clocks applied in the previous system clock capture cycles of the LBIST system in which unknowns (Xs) occurred more than a threshold number of times.

17. The system of claim 16, wherein the test system clock control circuitry further controls the providing of the multiple test system clocks from the LBIST system by selecting secondary clocks, the selecting of the secondary clocks including:
selecting, as the secondary clocks, clocks of the multiple test system clocks of the LBIST system that have been used less than a second set minimum number of times in previous system clock capture cycles where the LBIST system was applied; and
excluding, from the secondary clocks, clocks of the multiple test system clocks applied in the previous system clock capture cycles of the LBIST system in which the unknowns (Xs) occurred more than the threshold number of times.

18. The system of claim 17, wherein the controlling of the timing of the application of the clock cycles of the multiple test system clocks comprises:

staggering a pair of clocks which can cause disturb cells when applied in a same capture cycle so that the staggered pair of clocks limit the disturb cells, wherein the disturb cells occur in the logic that receives inputs clocked by two different ones of the multiple test system clocks causing different outputs of the logic during the system clock capture cycle.

19. A non-transitory computer readable medium comprising stored instructions, which when executed by a processor, cause the processor to:

provide multiple test system clocks, from a logic built in self-test (LBIST) system that tests the logic, to the logic during a system clock capture cycle of a system clock during testing of the logic, wherein the system clock is separate from the multiple test system clocks of the LBIST system; and control a timing of an application of clock cycles of the multiple test system clocks of the LBIST system provided to the logic during the system clock capture cycle.

20. The non-transitory computer readable medium of claim 19, wherein the control of the timing of the clock cycles comprises staggering pulses of a number of clocks of the multiple test system clocks of the LBIST system during the system clock capture cycle.

* * * * *